(12) United States Patent
Charles et al.

(10) Patent No.: US 7,689,763 B2
(45) Date of Patent: Mar. 30, 2010

(54) METHOD AND SYSTEM FOR REDUCING PIN COUNT IN AN INTEGRATED CIRCUIT WHEN INTERFACING TO A MEMORY

(75) Inventors: Gordon Charles, San Jose, CA (US); Emanuel Washington, Menlo Park, CA (US)

(73) Assignee: LSI Corporation, Milpitas, CA (US)

( * ) Notice: Subject to any disclaimer, the term of this patent is extended or adjusted under 35 U.S.C. 154(b) by 441 days.

(21) Appl. No.: 10/920,975

(22) Filed: Aug. 18, 2004

(65) Prior Publication Data
US 2006/0041713 A1 Feb. 23, 2006

(51) Int. Cl.
*G06F 12/00* (2006.01)
(52) U.S. Cl. ...................................... 711/105
(58) Field of Classification Search ........................ None
See application file for complete search history.

(56) References Cited

U.S. PATENT DOCUMENTS 6,289,413 B1 * 9/2001 Rogers et al. ............... 711/105
6,493,778 B1 * 12/2002 Lee et al. .................... 710/110

OTHER PUBLICATIONS

Micron 16Mb: x16 SDRAM Micron Technology, Aug. 1999.*
Micron 16MB: x16 SDRAM Micron Techology, Aug. 1999, pp. 1-51.*
Kahng, Andrew B. et al., "Filling Algorithms and Analyses for Layout Density Control," IEEE, vol. 18, No. 4, Apr. 1999, pp. 445-462.

* cited by examiner

*Primary Examiner*—Sanjiv Shah
*Assistant Examiner*—Duc T Doan
(74) *Attorney, Agent, or Firm*—Cochran Freund & Young LLC

(57) ABSTRACT

The invention provides a system and method for reducing pin count in an integrated circuit (IC) when interfacing to a synchronous dynamic random access memory (SDRAM). The SDRAM has a plurality of address lines and a plurality of data lines. The method includes connecting together the plurality of data lines and the plurality of address lines. The IC interfaces to the SDRAM through the connected plurality of address lines and the plurality of data lines.

11 Claims, 5 Drawing Sheets

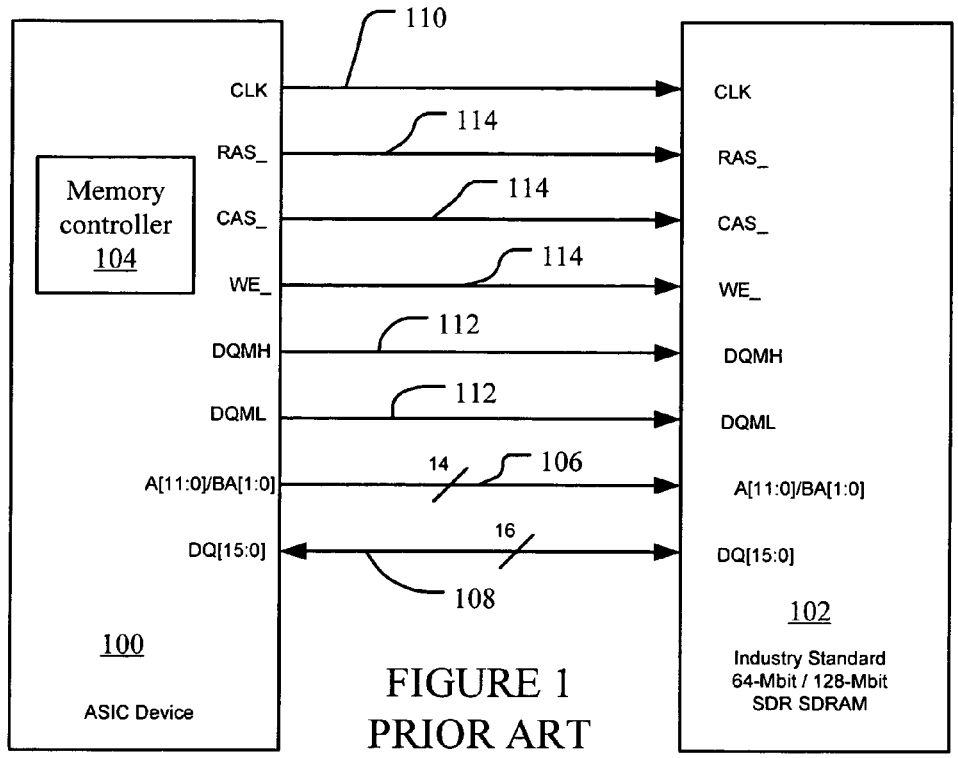
FIGURE 1
PRIOR ART
FIGURE 2
PRIOR ART
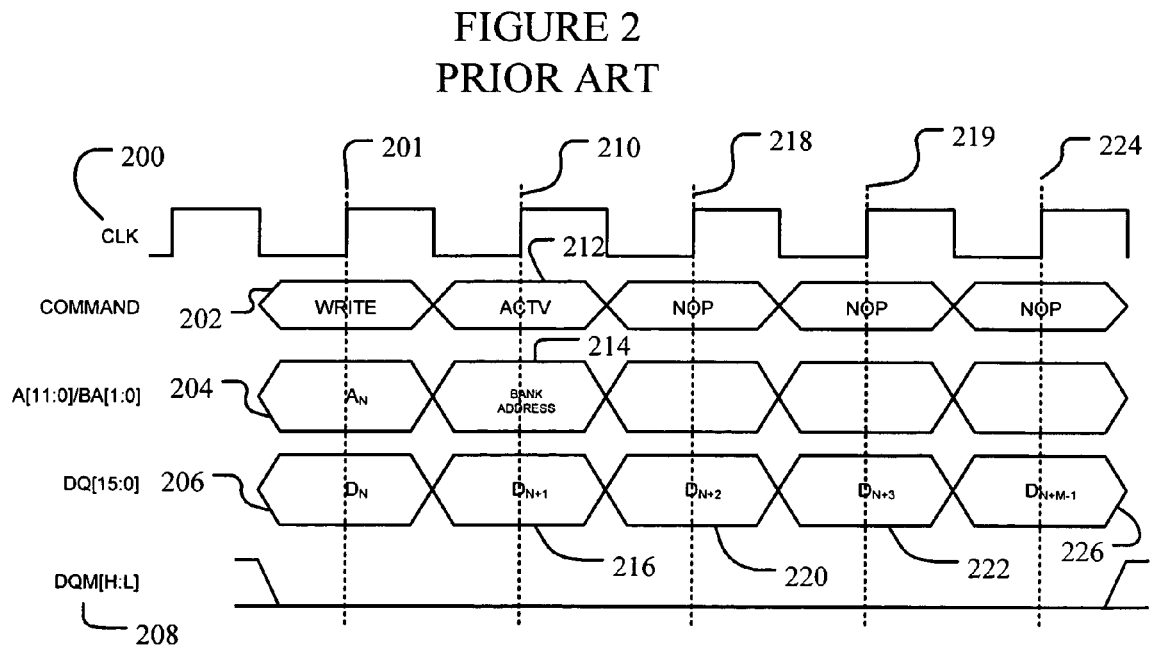

METHOD AND SYSTEM FOR REDUCING PIN COUNT IN AN INTEGRATED CIRCUIT WHEN INTERFACING TO A MEMORY

FIELD OF THE INVENTION

The present invention relates to integrated circuits, and more particularly to reducing pin count in an integrated circuit when interfacing to a memory.

BACKGROUND OF THE INVENTION

The majority of designs in the consumer electronic industry include an interface between an integrated circuit (IC) and a memory, the memory often known as a synchronous dynamic random access memory (SDRAM). An SDRAM is a memory chip, with different SDRAMs designed to hold different amounts of data and operate at different speeds.

De facto industry standards exist for the interface between an IC and a SDRAM. To better understand the limitations and operation of conventional systems, an example of an IC interfaced to a SDRAM according to the de facto standard is provided, along with write and read operations.

FIG. 1 is a block diagram illustrating a conventional IC 100 connected to standard SDRAM 102. IC 100 has memory controller 104 that operates SDRAM 102 according to the de facto standard for a memory interface. IC 100 reads data from SDRAM 102 during a read operation and writes data to SDRAM 102 during a write operation. Activate and pre-charge are examples of other operations performed by SDRAM 102 at various times. Address and bank select lines 106 are connected between IC 100 and SDRAM 102 and convey memory address location (row and column addresses) signals and bank select (determines source or destination bank) signals from IC 100 to SDRAM 102. Data lines 108 are connected between IC 100 and SDRAM 102 and convey data between IC 100 and SDRAM 102. Data is transmitted in both directions on data lines 108. Each of the above-mentioned lines connects to IC 100 through pins on the exterior of IC 100, most of the pins being controlled by memory controller 104.

Clock line 110 conveys a clock signal from IC 100 to SDRAM 102 and mask lines 112 are used by IC 100 to instruct SDRAM 102 to ignore data appearing on data lines 108. Control lines 114 convey control commands from IC 100 to SDRAM 102, for example read, write, activate, and pre-charge. In the example shown, there is one line for a clock signal, 3 lines for control signals, 2 lines for byte mask signals, 12 lines for memory address signals, 2 lines for bank select signals, and 16 lines for data signals, for a total of 36 pins from IC 100 needed in order to interface to SDRAM 102 according to the de facto standard.

FIG. 2 is a timing diagram illustrating a conventional write operation from the integrated circuit to the SDRAM of FIG. 1. FIG. 2 will be discussed in conjunction with the corresponding structure in FIG. 1. Clock signal 200 is transmitted along clock line 110 from IC 100 to SDRAM 102. Write command 202 is transmitted along command lines 114 to SDRAM 102. At time 201, address 204 is transmitted along address lines 106 and data 206 is transmitted along data lines 108. The timing and operation of the transmission follows the de facto standard for memory interfaces with SDRAM. SDRAM 102 receives data 206 and performs a write operation by putting data 206 in address 204 within SDRAM 102. Mask lines 112 are de-asserted, as indicated by mask signal 208, enabling the storage of the data to the memory. Throughout the specification, $D_N$ and $A_N$ will refer to particular (N) data that is going to a particular (N) address.

At time 210, IC 100 transmits activate command 212 along command lines 114 to SDRAM 102, along with address 214. SDRAM 102 responds by activating a bank address designated by address 214. Also at time 210, data 216 is transmitted to SDRAM 102. An internal counter (not shown) increments a group of cells (not shown) to which SDRAM 102 writes data each clock cycle. Since one clock cycle has passed, the position is incremented by one. Data 216, which is the next block of data transmitted by IC 100, is written into the next memory cell as indicated by the internal counter of SDRAM 102.

At time 218, no control command is transmitted along command lines 114, and data 220 is transmitted along data lines 108. The internal counter in SDRAM 102 has incremented the group of memory cells to which data 220 is written.

At time 219, no control command is transmitted along command lines 114, and data 222 is transmitted along data lines 108. The internal counter in SDRAM 102 has incremented the group of memory cells to which data 222 is written.

Finally, at time 224, no control command is transmitted along command lines 114, and data 226 is transmitted along data lines 108. Data 226 is the last portion of data written to SDRAM 102 in the write operation, which took 5 clock cycles to complete. During those 5 clock cycles activate command 210 was also transmitted from IC 100 to SDRAM 102.

In FIG. 3, a timing diagram illustrates a conventional read operation from the integrated circuit to the SDRAM of FIG. 1. FIG. 3 will be discussed in conjunction with the corresponding structure in FIG. 1. Clock signal 300 is transmitted along clock line 110 from IC 100 to SDRAM 102. Read command 302 is transmitted along one of command lines 114 to SDRAM 102. At time 301, address 304 is transmitted along address lines 106. The timing and operation of the transmission follows the de facto standard for memory interfaces with SDRAM. SDRAM 102 receives read command 302 and address 304 and prepares the memory cell at address 304 to read out data to IC 100. Mask lines 112 are de-asserted, as indicated by mask signal 308.

At time 310, no control command is transmitted along command lines 114 while SDRAM 102 prepares to read out data to IC 100.

At time 312, IC 100 transmits activate command 314 along command lines 114 and sends address 316 for the bank/row to activate (one skilled in the art will recognize that a bank address is not synonymous with a memory address, but for the purposes of this background the distinction is not important). Also at time 312, SDRAM 102 begins transmitting data to IC 100 as requested by read command 302, 2 clock cycles earlier. Note that the number of clock cycles from the assertion of a read command until SDRAM 102 responds with data is programmable according to the de facto SDRAM standard. The value is programmed by a controller according to it's abilities, the operating frequency and the speed grade of SDRAM 102. For example, values can be set to 1, 2 or 3 clock cycles.

At time 320, IC 100 transmits pre-charge command 322 along command lines 114 and sends address 324 for the bank to pre-charge. Also at time 320, the next data block is transmitted from SDRAM 102 to IC 100. The internal counter (not shown) discussed earlier operates in the same manner for read operations as it does for write operations. Next, mask signal 308 is asserted on mask lines 112. Mask lines 112 control the output enable signals and are timed to precede the data out from SDRAM 102 by two clock cycles, in this example.

At time 328, no control command is transmitted along command lines 114 while data 330, which is the last of the data, is read from SDRAM 102. Over the 5 clock cycles, 3 blocks of data were read out, and activate and pre-charge commands were issued.

The de facto standard was created to operate at a particular point in the trade off of pin count versus memory bandwidth, i.e. the more pins used, the more data may be transferred during a given clock cycle, while fewer pins means lower data transmission. The SDRAM interface often represents the most pin intensive interface in the design. High pin count, in the above case SDRAM 102 uses 36 pins, can result in forcing designs into larger and more expensive packages, either due to the number of pins required or due to the increase in power consumption required to switch all of the output signals.

Accordingly, what is needed is a method and system for reducing pin count in an integrated circuit when interfacing to a memory. The present invention addresses such a need.

BRIEF SUMMARY OF THE INVENTION

Aspects of the present invention include a system and method for reducing pin count in an integrated circuit (IC) when interfacing to an industry standard, for example the industry de facto synchronous dynamic random access memory (SDRAM) standard. The SDRAM has a plurality of address lines and a plurality of data lines. The method includes connecting together the plurality of data lines and the plurality of address lines. The IC interfaces to the SDRAM through the connected plurality of address lines and the plurality of data lines.

According to the method and system disclosed herein, the present invention reduces the number of pins required to interface to an SDRAM from an IC while still adhering to the industry standard. In designs where memory speed is not an issue, the availability of extra pins reduces the cost of production, reduces the amount of power required, and reduces noise. In many systems the presence of high speed I/O signal switching creates noise that is difficult to isolate. Reducing the number of simultaneously switching signals of an SDRAM bus typically reduces the noise generated by I/O switching. In one example, reducing memory pin requirements from 36 pins to 22 pins results in significant savings, while still adhering to the industry standard. The invention may be applied to most systems having an SDRAM interface, for example cable modems, DVD players and recorders, and video decoders.

BRIEF DESCRIPTION OF SEVERAL VIEWS OF THE DRAWINGS

FIG. 1 is a prior art block diagram illustrating an integrated circuit connected to an SDRAM.

FIG. 2 is a prior art timing diagram illustrating a write operation from the integrated circuit to the SDRAM of FIG. 1.

DETAILED DESCRIPTION OF THE INVENTION

The present invention relates to integrated circuits, and more particularly to reducing pin count in an integrated circuit when interfacing to a memory. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 3:
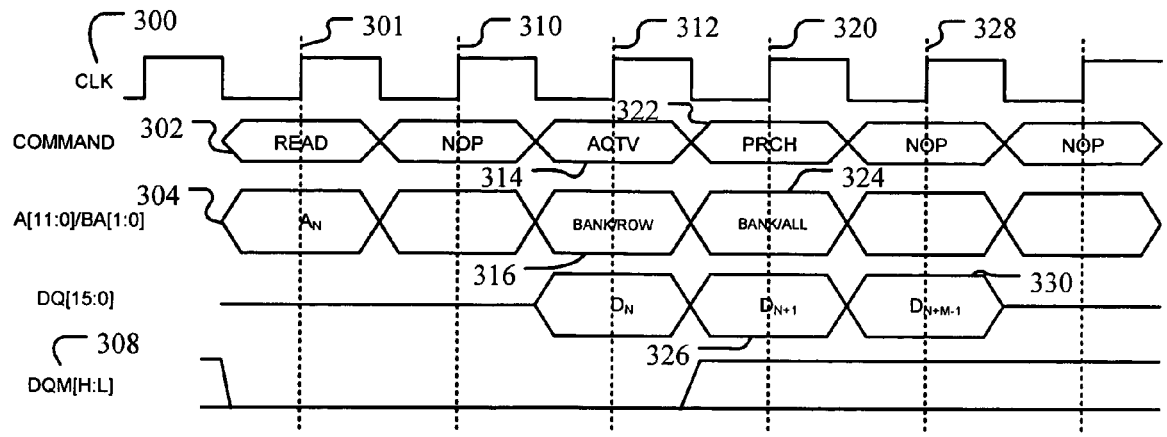
FIG. 3 is a prior art timing diagram illustrating a read operation from the integrated circuit to the SDRAM of FIG. 1.
Figure 4:
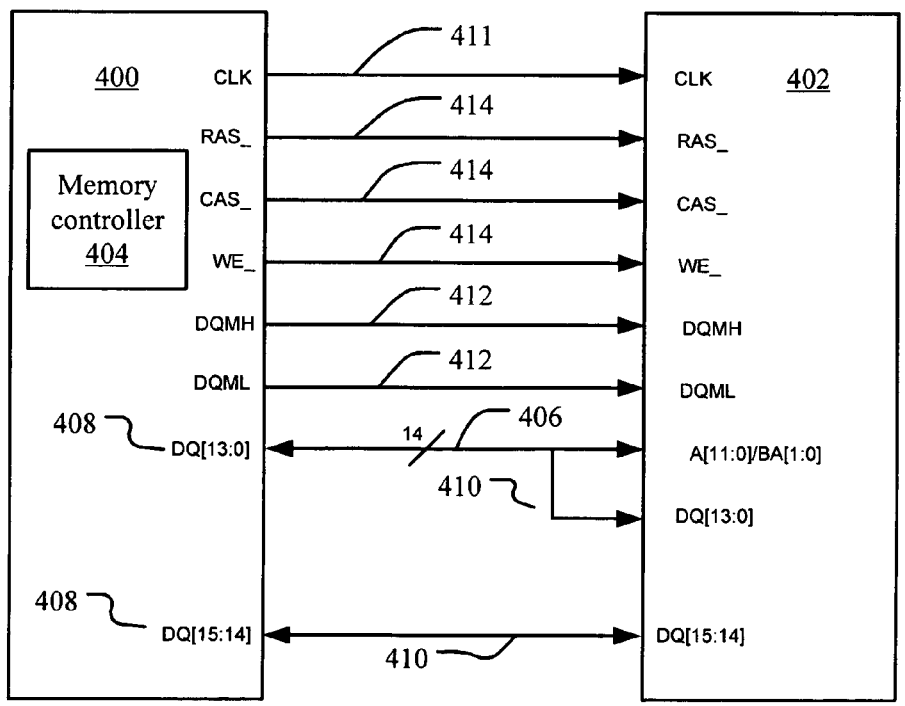
FIG. 4 is a block diagram illustrating one embodiment of the invention with an integrated circuit connected to an SDRAM.

FIG. 4 is a block diagram illustrating one embodiment of the invention with integrated circuit (IC) 400 connected to synchronous dynamic random access memory (SDRAM) 402. IC 400 may be an application specific integrated circuit (ASIC) while SDRAM 402 may be an industry standard 64 or 128-Mbit single data rate (SDR) SDRAM, for example.

IC 400 typically has more pins than shown and more lines that are omitted for simplicity. Memory controller 404 operates SDRAM 402 through pins in IC 400 according to one of the industry de facto SDRAM standard.

According to the present invention, address and data lines (buses) are connected together and operated with time division multiplexing according to the de facto standard, for example. Address and bank select lines 406 from SDRAM 403 convey memory address (location or row and column address) signals and bank select (select the bank—a physical entity) signals, and are connected to data pins 408 in IC 400. Address and data signals are sent over a shared bus. In this example, SDRAM 402 has 14 address and bank select lines. Each one of address and bank select lines 406 is connected to a respective data line 410. Only one data line 410 shares a connection with one address or bank select line 406, however not every data line 410 must connect to an address line (or vice versa). As there are 16 data lines 410 and only 14 address lines 406 in this example, 2 of data lines 410 are connected directly to data pins 408 and are not time division multiplexed. One skilled in the art will recognize that with different SDRAM packages, there will be a different number of data and address lines. In packages where there are more address than data lines, the address pins (not shown) on the IC may be better suited to convey the multiplexed signal, rather than the data pins as in this embodiment.

Data lines 410 convey data (information) between IC 400 and SDRAM 402. Clock line 411 conveys a clock signal from IC 400 to SDRAM 402 and mask lines 412 are used by IC 400 to instruct SDRAM 402 to ignore data appearing on data lines 410 (which are tied to address lines 406). Control lines 414 convey control commands from IC 400 to SDRAM 402, for example read, write, activate, and pre-charge. IC 400 reads data from SDRAM 402 during a read operation and writes data to SDRAM 402 during a write operation. Activate and pre-charge are examples of other operations performed by SDRAM 402 at various times. In this embodiment, there is one line for a clock signal, 3 lines for control signals, 2 mask lines for ignore signals, and 16 lines for memory address signals, bank select signals, and data signals, for a total of 22 pins from IC 400 needed in order to interface to SDRAM 402 according to the de facto standard (compared to 36 pins for the conventional system). A savings of 14 pins is achieved by tying the data, address, and bank select lines together.

Figure 5:
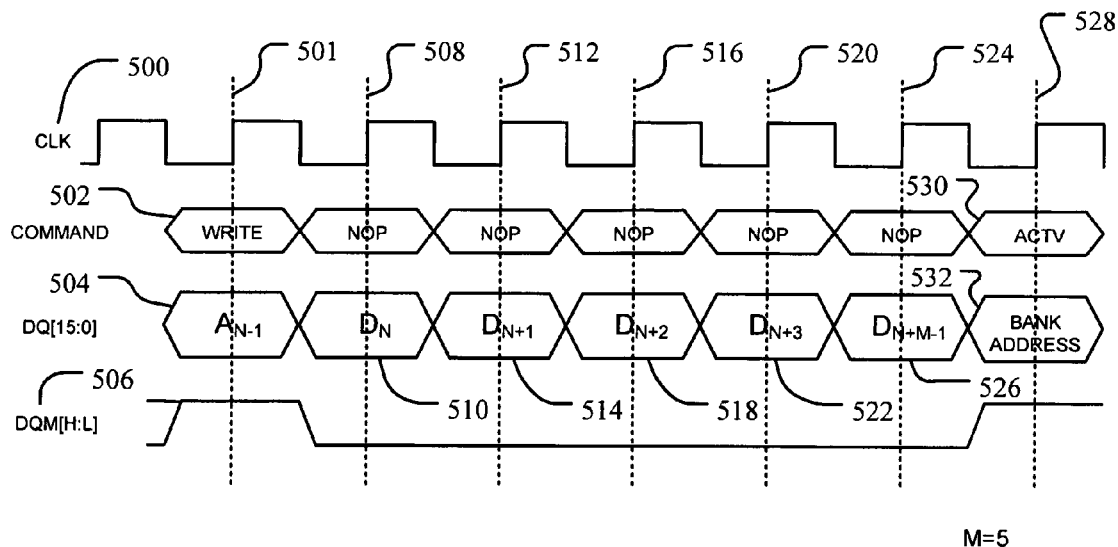
FIG. 5 is a timing diagram illustrating a write operation from the integrated circuit to the SDRAM of FIG. 4.

FIG. 5 is a timing diagram illustrating a write operation from IC 400 to SDRAM 402 of FIG. 4. FIG. 5 will be discussed in conjunction with the corresponding structure in FIG. 4. Clock signal 500 is transmitted along clock line 411 from IC 400 to SDRAM 402. Write command 502 is transmitted along one of command lines 414 to SDRAM 402.

At time 501, address 504 is transmitted from data pins 408 to address lines 406 and data lines 410. However, because address 504 is being transmitted along data lines 410, mask lines 412 must be asserted (as illustrated by mask signal 506) in order for SDRAM 402 to not write the input on data lines 410 into memory. Otherwise, SDRAM 402 would write the value of address 504 into memory, typically an undesirable result. Furthermore, because the combined data and address lines cannot convey both data and address signals, IC 400 must pause for a clock cycle before transmitting data to SDRAM 402. In order for the data to be written into the correct memory location, the desired address, N, is decremented by one before being transmitted by IC 400 in order to account for the internal counter of SDRAM 402. In this write operation, in order to write to memory location N, SDRAM 402 begins with memory location N−1. In order to write 5 blocks of data (m=5), memory locations N+M−1 are needed. If N=0 to begin with, locations 0-4 are used. SDRAM 402 receives address 504 and write command 502 and, according to the de facto standard, begins the counter. Since mask signals 506 are asserted, SDRAM 402 also ignores input on data lines 410, therefore nothing is written to address 504. Throughout the specification, DN and AN will refer to particular (N, N+1, etc.) data that is going to a particular (N, N+1, etc.) address.

At time 508 no control command is transmitted along command lines 414, and data 510 is transmitted from data pins 408 to address lines 406 and data lines 410. Full page mode data transfer may provide a more efficient solution for some designs. The internal counter in SDRAM 402 has incremented the memory cell to which data 510 is written, so that the first data packet of this group of packets is being written to the correct memory cell location, in line with the de facto standard. Mask signal 506 is deasserted in order that SDRAM 402 will receive and write memory data 510.

At time 512 no control command is transmitted along command lines 414. Any control command requiring an address should not be transmitted during the write operation because data lines 410 and address lines 406 are tied together. Transmitting an address would interfere with the write operation, consequently writing the value of the address into the memory location and probably corrupting the data. Examples of control commands requiring an address are pre-charge and activate.

At time 516 no control command is transmitted along command lines 414, and data 518 is transmitted from data pins 408 to address lines 406 and data lines 410. The internal counter in SDRAM 402 has incremented the memory cell to which data 518 is written.

At time 520 no control command is transmitted along command lines 414, and data 522 is transmitted from data pins 408 to address lines 406 and data lines 410. The internal counter in SDRAM 402 has incremented the memory cell to which data 522 is written.

At time 524 no control command is transmitted along command lines 414, and data 526 is transmitted from data pins 408 to address lines 406 and data lines 410. The internal counter in SDRAM 402 has incremented the memory cell to which data 526 is written.

At time 528, IC 400 transmits activate command 530 along command lines 414 to SDRAM 402, along with bank address 532. SDRAM 402 responds by activating a bank address designated by address 532. Mask signal 506 is asserted in order that SDRAM 402 ignores address 532 on data lines 410, otherwise some memory location may be corrupted.

In order to write 5 blocks of data (data 510, data 514, data 518, data 522, and data 526) and perform an activate command (activate command 530), SDRAM 402 required 6 clock cycles because control commands requiring address locations cannot be transmitted while the time division multiplexed bus is in use for data transfer. In order to transmit the address with the control command memory controller 404 must wait until the bus is free, not while data is bring written. Additionally, mask lines 412 should be asserted when an address is being transmitted from IC 400 to SDRAM 402 in order that SDRAM 402 does not overwrite any data. The timing and operation of the transmission follows the de facto standard for memory interfaces with SDRAM.

Figure 6:
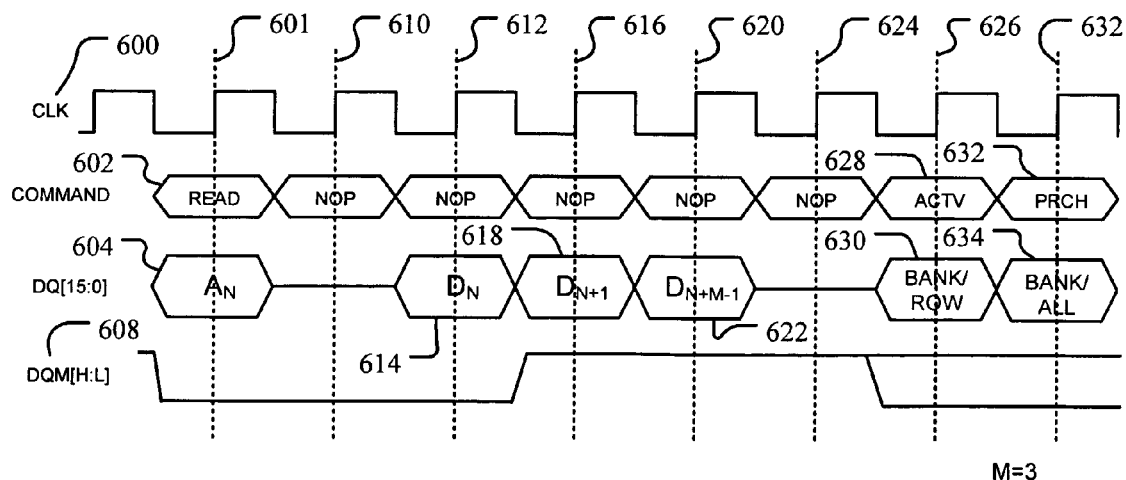
FIG. 6 is a timing diagram illustrating a read operation from the integrated circuit to the SDRAM of FIG. 4.

In FIG. 6, a timing diagram illustrates a read operation from the IC 400 to SDRAM 402 of FIG. 4. FIG. 6 will be discussed in conjunction with the corresponding structure in FIG. 4. Clock signal 600 is transmitted along clock line 411 from IC 400 to SDRAM 402. Read command 602 is transmitted along one of command lines 414 to SDRAM 402. At time 601, address 604 is transmitted from data pins 408 to address lines 406 and data lines 410. The timing and operation of the transmission follows the de facto standard for memory interfaces with SDRAM. SDRAM 402 receives read command 602 and address 604 and prepares the memory cell (not shown) at address 604 to read out data to IC 400. Mask lines 412 are de-asserted, as indicated by mask signal 608.

At time 610, no control command is transmitted along command lines 414 while SDRAM 402 prepares to read out data to IC 400.

At time 612, no control command is transmitted along command lines 414 while SDRAM 402 transmits data 614 on data lines 410 to data pins 408. As previously described, a control command requiring an address should not be transmitted while data is being transferred, otherwise there will be a conflict between the data being sent from SDRAM 402 and the address from IC 400.

At time 616, no control command is transmitted along command lines 414 while SDRAM 402 transmits data 618 on data lines 410 to data pins 408. The internal counter in SDRAM 402 increments to the next address. Mask signal 608 is asserted here according to the de facto standard. The mask signals precede the data by 2 clock cycles in this example (equivalent to the delay from read to the first data—this is programmable in the SDRAM.

At time 620, no control command is transmitted along command lines 414 while SDRAM 402 transmits data 622 on data lines 410 to data pins 408. Memory controller 404 continues to assert mask signal 608.

At time 624 no control command is transmitted according to the de facto standard in order for SDRAM 400 to exit the read operation.

At time 626 activate command 628 is transmitted from IC 400 along command lines 414 to SDRAM 402. The location of activate command is bank address 630, which is transmitted from data pins 408 to address lines 406 and data lines 410. There is a pipeline delay of two clock cycles for the mask signal so the effect of mask signal at time 626 is due to the value of the mask signal at time 620. Mask signal 608 is asserted on mask lines 414 in order that SDRAM 403 ignore address 630 on data lines 410.

Finally, at time 632, pre-charge command 632 is transmitted from IC 400 along command lines 414 to SDRAM 402. The location of pre-charge command is bank address 634, which is transmitted from data pins 408 to address lines 406 and data lines 410. There is a pipeline delay of two clock cycles for the mask signal so the effect of mask signal at time 632 is due to the value of the mask signal at time 624. Mask signal 608 is asserted on mask lines 414 in order that SDRAM 403 ignore address 634 on data lines 410.

In order to complete a data read with 3 blocks of data (data 614, data 618, and data 622), issue activate command 628 and pre-charge command 632, 7 clock cycles are needed in the time division multiplexing scheme of the present invention. Although only 5 clock cycles are needed in conventional systems, when bandwidth may be traded favorably for pins, the invention proves advantageous by freeing 14 pins, in this example, for other purposes.

While the previous figures have provided a specific embodiment of the invention, the following flow diagram is a more general embodiment.

Figure 7A:
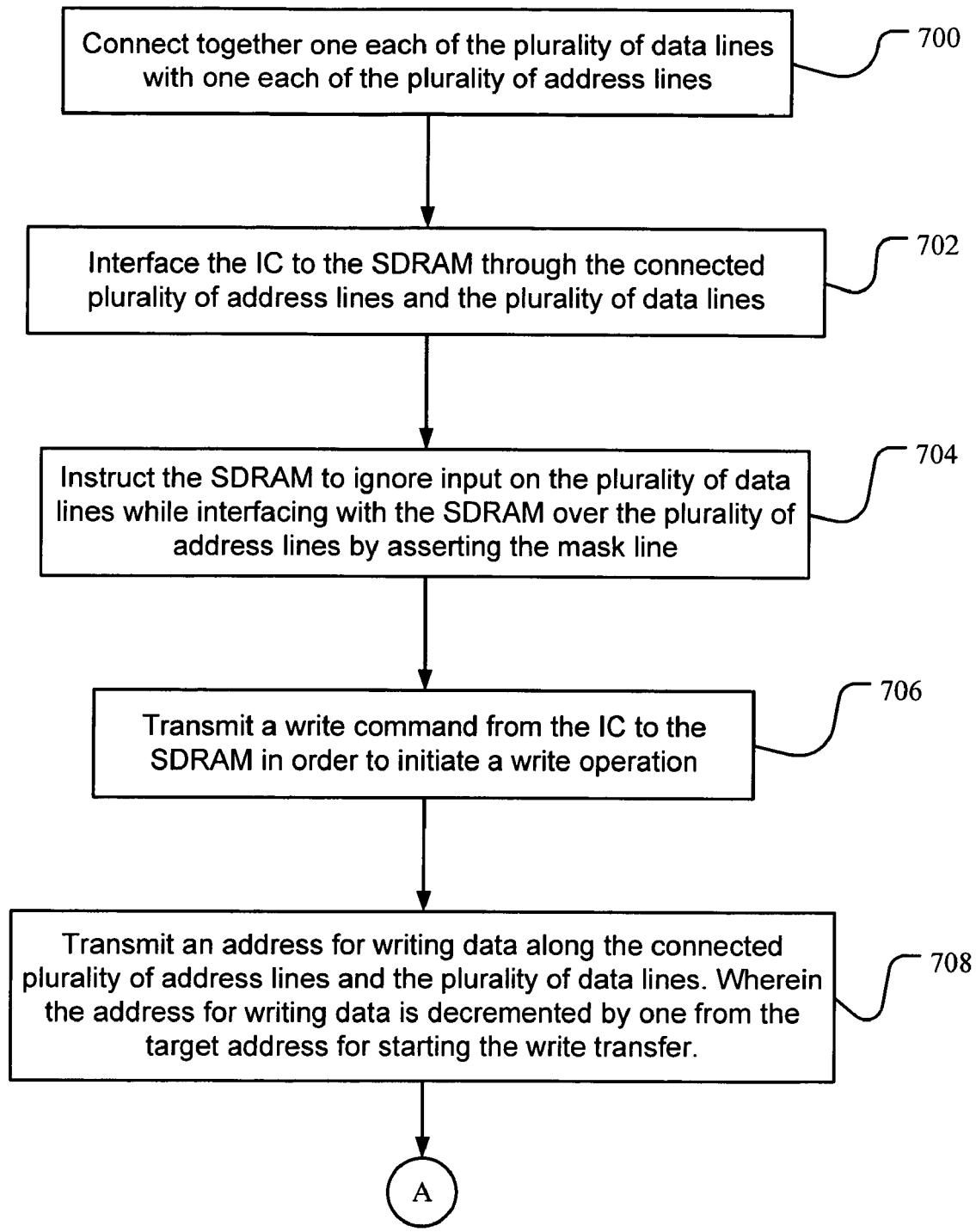
FIG. 7A is a flow diagram illustrating one method of implementing the invention.
Figure 7B:
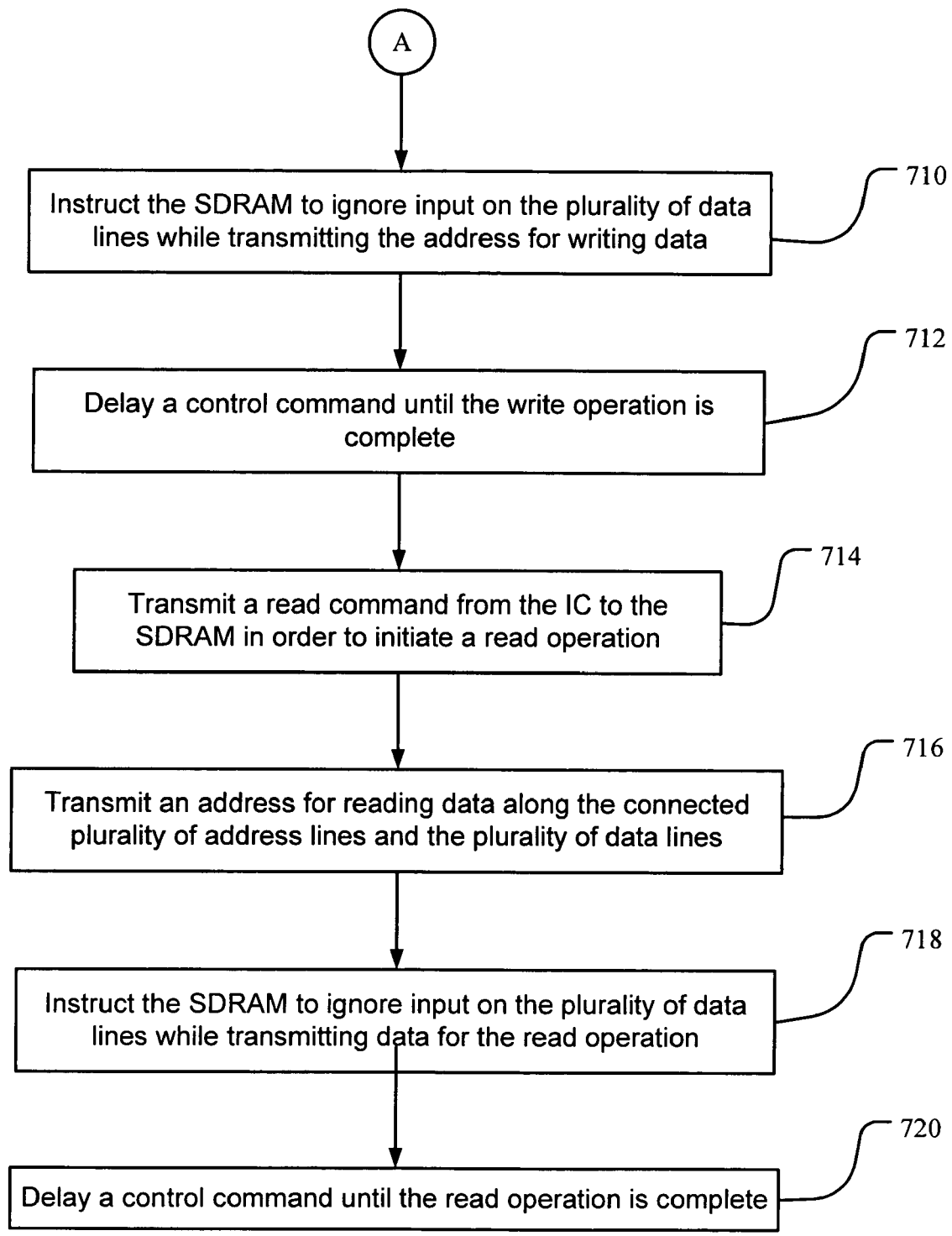
FIG. 7B is a flow diagram continuing the method from FIG. 7A.

FIGS. 7A and 7B are flow diagrams illustrating a process for implementing an interface in accordance with a preferred embodiment of the invention. The process begins by connecting together one each of data lines 410 with one each of address lines 406, as described in block 700.

In block 702, IC 400 is interfaced to SDRAM 402 through connected address lines 406 and data lines 410. In block 704, IC 400 instructs SDRAM 402 to ignore input on data lines 410 while interfacing with SDRAM 402 over address lines 406 by asserting mask lines 412.

In block 706, IC 400 transmits a write command to SDRAM 402 in order to initiate a write operation. In block 708, IC 400 transmits an address for writing data along address lines 406 and data lines 410, wherein the address for writing data is decremented by one from the target starting address for the data to be written during the write operation.

FIG. 7B is a flow diagram continuing the method illustrated in FIG. 7A. The process continues with block 710, where IC 400 instructs SDRAM 402 to ignore input on data lines 410 while transmitting the address for writing data. In block 712, memory controller 404 delays a control command until the write operation is complete, wherein the control command is activate or a pre-charge command.

In block 714, IC 400 transmits a read command to SDRAM 402 in order to initiate a read operation. In block 716, IC 400 transmits an address for reading data along address lines 406 and data lines 410. In block 718, IC 400 instructs SDRAM 402 to ignore input on data lines 410 while transmitting data for the read operation. In block 720, memory controller 404 delays a control command until the read operation is complete. In the preferred embodiment, the control command is an activate or a pre-charge command.

According to the method and system disclosed herein, the present invention reduces the number of pins required to interface to an SDRAM from an IC while still adhering to the de facto standard by providing a shared address and data bus. In designs where memory bandwidth is less than 100% utilized, the availability of extra pins reduces the cost of production, reduces the amount of power required, and reduces noise. In many systems the presence of high speed I/O signal switching creates noise that is difficult to isolate. Reducing the number of simultaneously switching signals of an SDRAM bus typically reduces the noise generated by I/O switching. The invention may be applied to most systems having an SDRAM interface, for example cable modems, DVD players and recorders, and video decoders.

A method and system for reducing pin count in an integrated circuit when interfacing to a memory has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A method of operating an interface for reducing pin count in an integrated circuit (IC) when interfacing with a synchronous dynamic random access memory chip (SDRAM), the SDRAM having a plurality of input address pins, a plurality of input/output data pins, and an internal memory, the IC having a set of data pins, comprising:

connecting together each one of the plurality of input/output data pins of the SDRAM to a respective one of the plurality of input address pins of the SDRAM to form a shared bus;

interfacing the IC to the SDRAM through the shared bus, wherein each line of the shared bus is connected to a respective one of the set of data pins of the IC, a respective one of the plurality of input address pins of the SDRAM, and a respective one of the plurality of input/output data pins of the SDRAM;

during a first clock cycle, sending a write command from the IC to the SDRAM via command lines to initiate a write operation at the SDRAM, sending an address for writing data via the shared bus from the set of data pins of the IC to the plurality of input address pins and the plurality of input/output data pins of the SDRAM, and asserting mask signals on mask lines by the IC such that the SDRAM does not write the address sent to the plurality of input/output data pins of the SDRAM as data for the write operation into the internal memory of the SDRAM;

during a second through M clock cycles, sending write data via the shared bus to the plurality of input address pins of the SDRAM and the plurality of input/output data pins of the SDRAM, and deasserting at least one of the mask signals on the mask lines by the IC, wherein the SDRAM writes the write data into the internal memory of the SDRAM; and during an M+1 clock cycle, sending an activate command from the IC to the SDRAM along the command lines, sending a bank address via the shared bus from the set of data pins of the IC to the plurality of input address pins of the SDRAM and the plurality of input/output data pins of the SDRAM, and asserting the mask signals on the mask lines.

2. The method of claim 1 wherein the address for writing data is modified from an address to which data will be written during the write operation.

3. The method of claim 1 further comprising:
delaying the activate command until the write operation is complete.

4. The method of claim 1, wherein M comprises a number of data blocks.

5. A method of operating an interface with for reducing pin count in an integrated circuit (IC) when interfacing with a synchronous dynamic random access memory chip (SDRAM) having a plurality of input address pins, a plurality of input/output data pins, and an internal memory, the IC having a set of data pins, comprising:

connecting together each one of the plurality of input/ output data pins of the SDRAM to a respective one of the plurality of input address pins of the SDRAM to form a shared bus;

interfacing the IC to the SDRAM through the shared bus, wherein the shared bus is connected to the set of data pins of the IC, the plurality of input address pins of the SDRAM, and the plurality of input/output data pins of the SDRAM, wherein each of the set of data pins of the IC is connected to both a respective one of the input/output a data pins of the SDRAM and respective one of the input address pins of the SDRAM;

during a first clock cycle, sending a read command from the IC to the SDRAM via command lines to initiate a read operation at the SDRAM, sending an address for reading data via the shared bus from the set of data pins of the IC to the plurality of input address pins of the SDRAM and the plurality of input/output data pins of the SDRAM, and deasserting mask signals on mask lines by the IC, wherein during a second clock cycle, the SDRAM prepares to read out data from the internal memory;

during a third through M clock cycles, receiving read data via the shared bus from the plurality of input/output data pins of the SDRAM to the set of data pins of the IC, and asserting the mask signals on the mask lines by the IC;

wherein during an M+1 clock cycle, the SDRAM exits the read operation;

during an M+2 clock cycle, sending an activate command from the IC to the SDRAM via the command lines, sending a first bank address via the shared bus from the set of data pins of the IC to the plurality of input address pins of the SDRAM and the plurality of input/output data pins of the SDRAM, and asserting the mask signals on the mask; and during an M+3 clock cycle, sending a pre-charge command from the IC to the SDRAM via the command lines, sending a second bank address along the shared bus from the set of data pins of the IC to the plurality of input address pins of the SDRAM and the plurality of input/output data pins of the SDRAM, and asserting the mask signals on the mask lines by the IC such that the SDRAM does not write the second bank address received at the plurality of input/output data pins of the SDRAM into the internal memory of the SDRAM.

6. The method of claim 3 further comprising:
delaying the activate and the pre-charge commands until the read operation is complete.

7. The method of claim 3, wherein M comprises a number of data blocks.

8. A system for reducing pin count in an integrated circuit (IC) when interfacing with a synchronous dynamic random access memory chip (SDRAM), comprising:

the SDRAM comprising a plurality of input address pins, a plurality of input/output data pins, and an internal memory, wherein each of the plurality of input/output data pins of the SDRAM is connected to a respective one of each of the plurality of input address pins of the SDRAM to form a shared bus;

the IC comprising a set of data pins that are each respectively connected on the shared bus to both a respective one of the plurality of input/output data pins of the SDRAM and a respective one of the plurality of input address pins of the SDRAM; and a memory controller coupled to the set of data pins of the IC and configured to transmit data signals and address signals to the plurality of input/output data pins of the SDRAM and the plurality of input address pins of the SDRAM, wherein during a first clock cycle, the memory controller sends a write command to the SDRAM to initiate a write operation at the SDRAM, sends an address for writing data via the shared bus to the plurality of input address pins of the SDRAM and the plurality of input/output data pins of the SDRAM, and asserting mask signals on mask lines such that the SDRAM does not write the address received at the plurality of input/output data pins of the SDRAM into the internal memory of the SDRAM, wherein during a second through M clock cycles, the memory controller sends write data via the shared bus to the plurality of input address pins of the SDRAM and the plurality of input/output data pins of the SDRAM, and deasserts the mask signals on the mask lines wherein the SDRAM writes the write data into the internal memory of the SDRAM, and wherein during an M+1 clock cycle, the memory controller sends an activate command to the SDRAM via the command lines, sends a bank address via the shared bus to the plurality of input address pins of the SDRAM and the plurality of input/output data pins of the SDRAM, and asserts at least one of the mask signals on the mask lines.

9. The system of claim 8, wherein M comprises a number of data blocks.

10. A system for reducing pin count in an integrated circuit (IC) when interfacing with a synchronous dynamic random access memory (SDRAM), comprising:

the SDRAM comprising a plurality of input address pins, a plurality of input/output data pins, and an internal memory, wherein each of the plurality of input/output data pins of the SDRAM is connected to a respective one of each of the plurality of input address pins of the SDRAM to form a shared bus;

the IC comprising a set of data pins that are each respectively connected on the shared bus to both a respective one of the plurality of input/output data pins of the SDRAM and a respective one of the input address pins of the SDRAM; and a memory controller coupled to the set of data pins of the IC and configured to transmit data signals and address signals to the plurality of input/output data pins of the SDRAM and the plurality of input address pins of the SDRAM, wherein during a first clock cycle, the memory controller sends a read command to the SDRAM via command lines to initiate a read operation at the SDRAM, sends an address for reading data via the shared bus to the plurality of input address of the SDRAM pins and the plurality of input/output data pins of the SDRAM, and deasserts mask signals on mask lines, wherein during a second clock cycle, the SDRAM prepares to read out data, from the internal memory of the SDRAM, to the shared bus, and the memory controller asserts the mask signals on the mask lines, wherein during an M+1 clock cycle, the SDRAM exits the read operation, wherein during an M+2 clock cycle, the memory controller sends an activate command to the SDRAM via the command lines, sends a first bank address along the shared bus to the plurality of input address pins of the SDRAM and the plurality of input/output data pins of the SDRAM, and asserts the mask signals on the mask lines such that the SDRAM does not write the first bank address received at the input/output data pins of the SDRAM into the internal memory of the SDRAM, and wherein during an M+3 clock cycle, the memory controller sends a pre-charge command to the SDRAM via the command lines, sends a second bank address via the shared bus to the plurality of input address pins of the SDRAM and the plurality of input/output data pins of the SDRAM, and asserts at least one of the mask signals on the mask lines.

11. The system of claim 10, wherein M comprises a number of data blocks.

* * * * *